(12) United States Patent
Kodera et al.

(10) Patent No.: US 9,196,501 B2
(45) Date of Patent: Nov. 24, 2015

(54) METHOD FOR CHEMICAL PLANARIZATION AND CHEMICAL PLANARIZATION APPARATUS

(75) Inventors: Masako Kodera, Kanagawa-ken (JP); Yukiteru Matsui, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,969

(22) Filed: Mar. 16, 2012

(65) Prior Publication Data

US 2013/0115774 A1 May 9, 2013

(30) Foreign Application Priority Data

Nov. 9, 2011 (JP) ................................. 2011-245683

(51) Int. Cl.
*B44C 1/22* (2006.01)
*H01L 21/302* (2006.01)
*H01L 21/461* (2006.01)
*H01L 21/3105* (2006.01)

(52) U.S. Cl.
CPC ................................ *H01L 21/31055* (2013.01)

(58) Field of Classification Search
USPC ........................................................ 438/692
See application file for complete search history.

(56) References Cited

U.S. PATENT DOCUMENTS

| 5,220,482 | A | | 6/1993 | Takemura et al. | |
|---|---|---|---|---|---|
| 5,468,682 | A | * | 11/1995 | Homma | ......................... 438/633 |
| 5,489,336 | A | * | 2/1996 | Kodera et al. | ................. 118/400 |
| 5,997,948 | A | * | 12/1999 | Dick et al. | ............... 427/255.11 |
| 6,012,967 | A | * | 1/2000 | Satake et al. | ..................... 451/36 |
| 2004/0035153 | A1 | * | 2/2004 | Koike et al. | ........................ 65/61 |
| 2004/0259479 | A1 | * | 12/2004 | Sevilla | ............................ 451/41 |
| 2009/0061741 | A1 | * | 3/2009 | Wang et al. | ..................... 451/56 |
| 2009/0267020 | A1 | * | 10/2009 | Lee et al. | ..................... 252/79.1 |

FOREIGN PATENT DOCUMENTS

| JP | 6-302598 | 10/1994 |
|---|---|---|
| JP | 7-173456 | 7/1995 |
| JP | 2009-206419 | 9/2009 |
| JP | 2011-120989 | 6/2011 |

OTHER PUBLICATIONS

Notification of Reason(s) for Refusal issued by the Japanese Patent Office on Oct. 17, 2014, for Japanese Patent Application No. 2011-245683, and English-language translation thereof.

* cited by examiner

*Primary Examiner* — Binh X Tran
*Assistant Examiner* — Thomas Pham
(74) *Attorney, Agent, or Firm* — Finnegan, Henderson, Farabow, Garrett & Dunner, L.L.P.

(57) ABSTRACT

According to one embodiment, a method for chemical planarization includes: preparing a treatment liquid containing a hydrosilicofluoric acid aqueous solution containing silicon dioxide dissolved therein at a saturated concentration; and decreasing height of irregularity of a silicon dioxide film. In the decreasing, dissolution rate of convex portions is made larger than dissolution rate of concave portion of the irregularity while changing equilibrium state of the treatment liquid at areas being in contact with the convex portions of the irregularity, in a state in which the silicon dioxide film having the irregularity is brought into contact with the treatment liquid.

12 Claims, 5 Drawing Sheets

METHOD FOR CHEMICAL PLANARIZATION AND CHEMICAL PLANARIZATION APPARATUS

CROSS-REFERENCE TO RELATED APPLICATIONS

This application is based upon and claims the benefit of priority from the prior Japanese Patent Application No. 2011-245683, filed on Nov. 9, 2011; the entire contents of which are incorporated herein by reference.

FIELD

Embodiments described herein relate generally to a method for chemical planarization and a chemical planarization apparatus.

BACKGROUND

In a manufacturing process of electronic devices such as semiconductor devices and micro electro mechanical systems (MEMS), when planarizing a thin film or the surface of a substrate, a chemical mechanical planarization (CMP) method is used. In CMP, polishing damage (scratches) caused by abrasive grains (physical abrasive) provides cause of yield reduction.

There is a catalyst-referred etching (CARE) method using a catalyst plate having reactive species on the surface. Although the method can be applied to the planarization of SiC, GaN, and metal, it cannot be applied to the planarization of a silicon dioxide film widely used as an insulating film of LSI etc.

DETAILED DESCRIPTION

Figure 1:
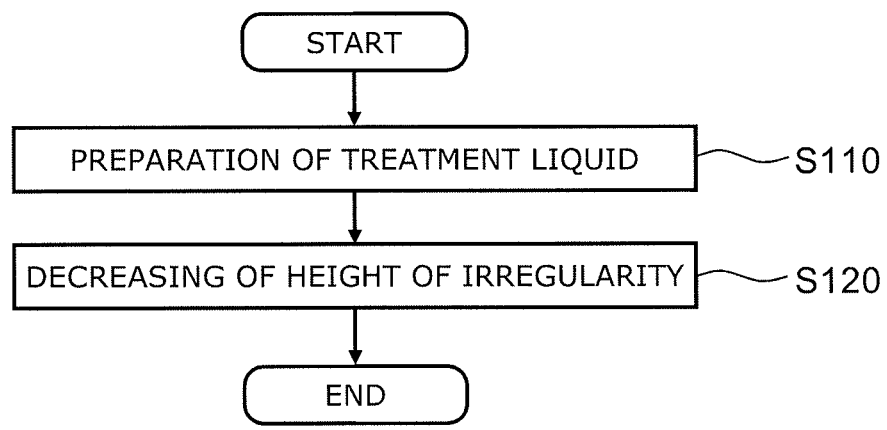
FIG. 1 is a flowchart view illustrating a method for chemical planarization according to a first embodiment.

In general, according to one embodiment, a method for chemical planarization includes: preparing a treatment liquid containing a hydrosilicofluoric acid aqueous solution containing silicon dioxide dissolved therein at a saturated concentration; and decreasing height of irregularity of a silicon dioxide film. In the decreasing, dissolution rate of convex portions is made larger than dissolution rate of concave portion of the irregularity while changing equilibrium state of the treatment liquid at areas being in contact with the convex portions of the irregularity, in a state in which the silicon dioxide film having the irregularity is brought into contact with the treatment liquid.

In general, according to another embodiment, a method for chemical planarization includes: preparing a treatment liquid containing a hydrosilicofluoric acid aqueous solution containing silicon dioxide dissolved therein at a saturated concentration; and decreasing height of irregularity of a silicon dioxide film by generating precipitation of silicon dioxide on concave portions of the irregularity while bringing a treatment plate into contact with convex portions of the irregularity and changing relative positions between the convex portions and the treatment plate to change equilibrium state of the treatment liquid, in a state in which the silicon dioxide film having the irregularity is brought into contact with the treatment liquid.

In general, according to another embodiment, a chemical planarization apparatus includes: a treatment container capable of storing a to-be-treated substrate provided with a silicon dioxide film having irregularity; a treatment liquid supplying part for supplying a treatment liquid containing a hydrosilicofluoric acid aqueous solution containing silicon dioxide in the treatment container; a control part for controlling concentration of silicon dioxide in the treatment liquid and temperature of the treatment liquid; and an equilibrium changing part for decreasing height of the irregularity by generating at least any of dissolution of convex portions of the irregularity and precipitation of silicon dioxide on concave portions of the irregularity while changing equilibrium state of the treatment liquid, in a state in which the silicon dioxide film is brought into contact with the treatment liquid.

Embodiments according to the invention will now be described with reference to drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a flowchart view illustrating a method for chemical planarization according to a first embodiment. As shown in FIG. 1, the method for chemical planarization according to the embodiment, includes a process of preparing a treatment liquid (step S110), and a process of decreasing the height of irregularity of a silicon dioxide ($SiO_2$) film (to-be-processed film) having irregularity, using the treatment liquid (step S120).

The treatment liquid contains a hydrosilicofluoric acid ($H_2SiF_6$) aqueous solution. The hydrosilicofluoric acid aqueous solution contains silicon dioxide dissolved therein at a saturated concentration.

The process of decreasing the height of irregularity includes generating dissolution of the convex portions of the irregularity by changing the equilibrium state of the treatment liquid while bringing the silicon dioxide film having irregularity into contact with the treatment liquid. As a method for bringing the silicon dioxide film into contact with the treatment liquid, for example, immersing the silicon dioxide film in the treatment liquid is used.

Figure 2:
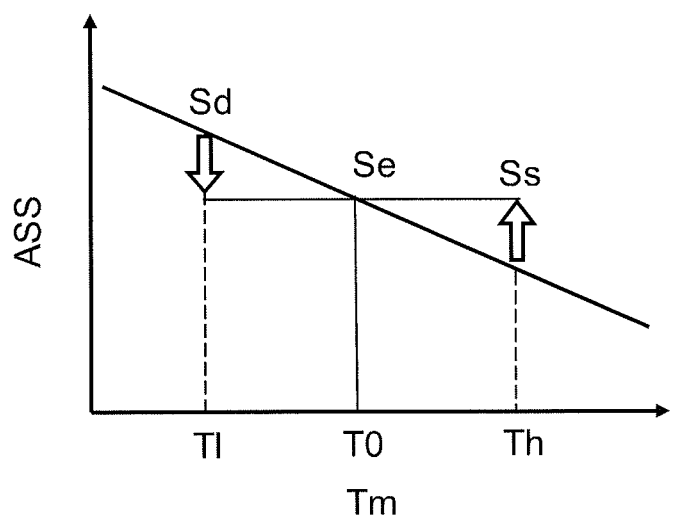
FIG. 2 is a graph view illustrating the characteristics of the method for chemical planarization according to the first embodiment.

FIG. 2 is a graph view illustrating the characteristics of the method for chemical planarization according to the first embodiment.

FIG. 2 illustrates the equilibrium state in the hydrosilicofluoric acid aqueous solution. In FIG. 2, the horizontal axis represents temperature Tm of the treatment liquid, and the vertical axis represents an amount of saturation dissolution ASS of $SiO_2$.

As shown in FIG. 2, as the temperature Tm increases, the amount of saturation dissolution ASS of $SiO_2$ decreases. Temperature when the treatment liquid is made is referred to as, for example, T0. At temperature T0, the treatment liquid is in equilibrium state Se. At temperature Th higher than temperature T0, the treatment liquid is in precipitation state Ss, and thus $SiO_2$ is precipitated from the solution. At temperature TI lower than temperature T0, the treatment liquid is in dissolution state Sd, and thus $SiO_2$ is dissolved in the treatment liquid.

That is, the following equilibrium formula (1) is satisfied in a hydrosilicofluoric acid aqueous solution (solution) in which $SiO_2$ is dissolved in a hydrofluoric acid aqueous solution at a saturated concentration.

$$H_2SiF_6 + 2H_2O \rightarrow SiO_2 + 6HF \qquad (1)$$

In equilibrium situation Se, even when $SiO_2$ is brought into contact with the solution, $SiO_2$ is not dissolved therein.

In formula (1), when the state is moved (changed) from the right side state to the left side state, $SiO_2$ is dissolved by the solution. As a method for changing the state, for example, decreasing the temperature Tm of the solution is used. By this, $SiO_2$ is dissolved. In the method for chemical planarization according to the embodiment, the phenomenon is utilized. As described later, in the embodiment, the method for changing the state is arbitrary.

In the embodiment, for example, by changing the equilibrium state of the treatment liquid at the places contacting with the convex portions of the irregularity, dissolution rate of the convex portions is made larger than the dissolution rate of the concave portions of the irregularity. Because of this, dissolution of the convex portions of the irregularity is generated.

The embodiment is not limited to this, and a process in which at least any one of dissolution of the convex portions of the irregularity and precipitation of silicon dioxide on the concave portions of the irregularity is generated by changing the equilibrium state of the treatment liquid, may also be used. Hereinafter, a case in which dissolution of the convex portions of the irregularity is generated will be described.

Figure 3A:
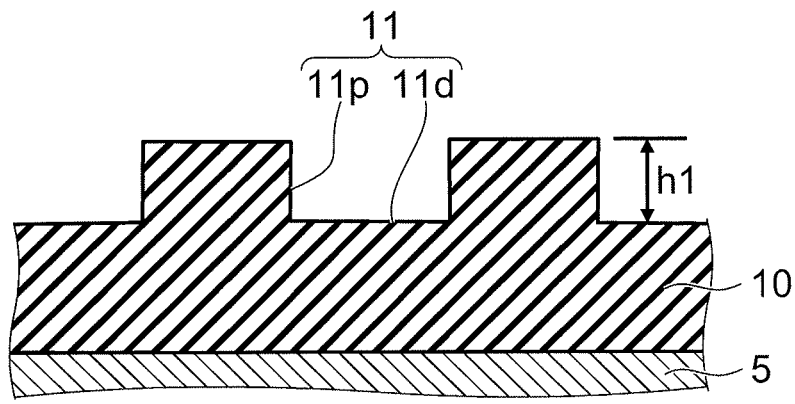
FIGS. 3A to 3C are schematic cross-sectional views illustrating the method for chemical planarization according to the first embodiment in the order of processes.
Figure 3B:
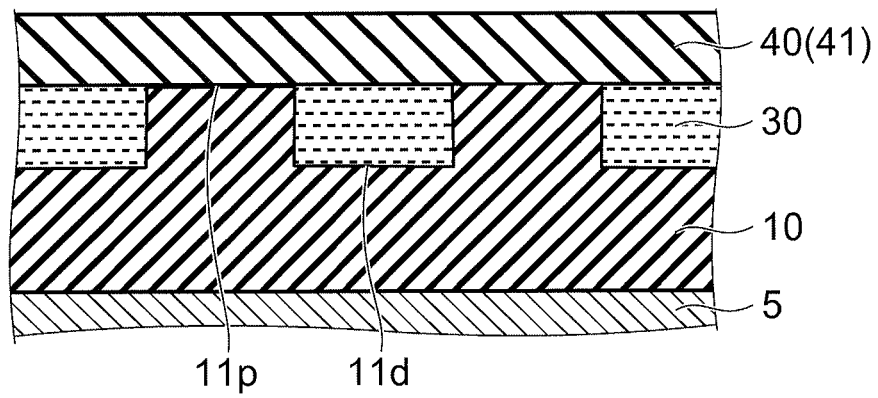
Figure 3C:
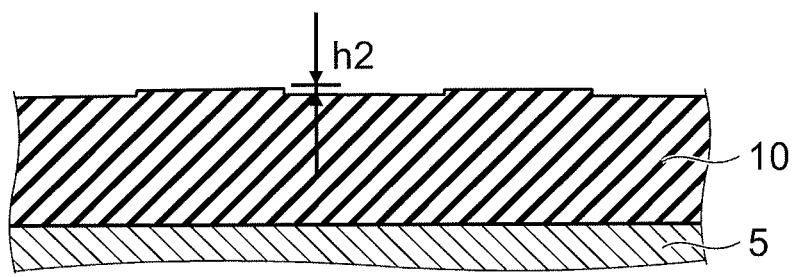

FIGS. 3A to 3C are schematic cross-sectional views illustrating the method for chemical planarization according to the first embodiment in the order of processes.

As shown in FIG. 3A, in the method for chemical planarization the method for chemical planarization according to the first embodiment according to the first embodiment, the silicon dioxide film 10 has irregularity 11. The irregularity 11 has convex portions 11p and concave portions 11d. When the method according to the embodiment is used for semiconductor devices such as LSI, distance between the upper face of the convex portions 11p and the lower face of the concave portions 11d (height h1 of the irregularity 11) is, for example, not less than 30 nanometers (nm) and not more than about 2 micrometers (μm). Furthermore, when the method is used for electronic devices such as MEMS, the height h1 may be, for example, about 20 μm.

In the embodiment, the silicon dioxide film 10 is formed by, for example, a CVD (chemical vapor deposition) method or a coating method. The silicon dioxide film 10 is formed, for example, on the major surface of a base body 5. The base body 5 is, for example, a substrate etc. of semiconductor devices such as a semiconductor memory, a high-speed logic LSI, a system LSI, and a memory-logic hybrid LSI.

As shown in FIG. 3B, the silicon dioxide film 10 having irregularity 11 is brought into contact with (for example, immersed in) the treatment liquid 30. Then, temperature of the convex portions 11p is decreased while bringing the parts 11p into contact with a treatment plate 40. For example, as the treatment plate 40, a temperature controlling plate 41 capable of being cooled is used. That is, in a first approach for changing an equilibrium state, the temperature controlling plate 41 is used.

By bringing the temperature controlling plate into contact with the convex portions 11p, the temperature of the convex portions 11p is decreased, and thus the equilibrium state of the treatment liquid 30 being in contact with the convex portions 11p changes. Thus, the equilibrium state of the treatment liquid 30 at places being in contact with the convex portions 11p changes, and, the convex portions 11p are dissolved by the treatment liquid 30. At the concave portions 11d in which the temperature is higher than the temperature of the convex portions 11p, the silicon dioxide film 10 is not dissolved or the degree of dissolution is small. That is, the dissolution rate of the convex portions 11p is larger than the dissolution rate of the concave portions 11d.

Because of this, as shown in FIG. 3C, after planarization treatment, a state in which the height h2 (depth) of the irregularity 11 after being processed is smaller than the height h1 (depth) of the initial irregularity 11 is achieved.

In bringing the treatment plate 40 into contact with the convex portions 11p, the relative position between the silicon dioxide film 10 and the treatment plate 40 may be changed while bringing the treatment plate 40 and the silicon dioxide film 10 into contact with each other. For example, at least any one of the silicon dioxide film 10 and the treatment plate 40 may be rotated while being brought into contact with each other, may be used. The axis of the rotation is in a direction perpendicular to a plane on which the silicon dioxide film 10 and the treatment plate 40 are brought into contact with each other. By the above mentioned change of the relative position (for example, rotation), temperature of the plurality of convex portions 11p becomes more uniform, thereby allowing more uniform treatment than ever. Furthermore, dissolution of the convex portions 11p is promoted.

In the embodiment, for example, the treatment liquid 30 contains substantially no abrasive grain. Therefore, generation of scratches caused by the abrasive grains is suppressed.

For example, in a mechanical polishing method (such as, lapping), processing is carried out selectively from the convex portions 11p of the silicon dioxide film 10, and a flat face can be achieved when the convex portions 11p are substantially removed. For this reason, the thickness of polishing is almost equivalent to the depth h1 of irregularity, and thus planarization can be carried out efficiently. However, by the mechanical polishing method, the damage on the surface of the silicon dioxide film 10 is great, and a damage layer deteriorated by processing is formed. For this reason, it is difficult for the method to be applied to minute elements required to have high characteristics and high accuracy.

In contrast, in, for example, chemical polishing methods (wet etching etc.) using no abrasive grain, isotropic etching using, for example, an etchant, is carried out. In the method, mechanical damage is not generated on the surface of the silicon dioxide film 10. However, the etching rate of the convex portions 11p is not sufficiently larger than the etching rate of the concave portions 11d, and thus in order to achieve a flat face, it is required that etching is carried out to a depth significantly larger than the depth h1 of the irregularity 11. For this reason, amount of processing required for planarization is large, thereby resulting in low efficiency. Furthermore, in some cases, flatness may be even more degraded by etch-pits than ever. In addition, corrosion may also occur.

Furthermore, there is a CMP method obtained by modifying these methods. It is possible for the CMP method to make flatness of the surface of an LSI device to be not more than 50 nm, and to achieve a flat face with average surface roughness (Ra) of not less than 1 nm. However, since abrasive grains are used in the CMP method, scratches caused by abrasive residues etc. are generated. The suppression of the number and the size of scratches have been tried by modifying the CMP method. In contrast, since the LSI device has been made small, demands for the number and the size of scratches have increased. For example, in a shallow trench isolation (STI) process in manufacture of LSIs, a fine trench pattern having a size of, for example, several nanometers is formed. A silicon dioxide film formed on the entire face of the base body so as to cover the fine trench pattern is planarized, and the silicon dioxide film is embedded only in the trench. Since a transistor is formed on the planarized surface, especially, it is necessary to suppress scratches. In spite of such a requirement, it is difficult for the CMP method using abrasive grains to suppress scratches sufficiently.

There is a catalyst-referred etching method. The method is used for planarization of to-be-processed films of SiC, GaN, and a metal. However, a material of an to-be-processed object to which the method is applicable is limited, and a technology for planarizing the convex portions of silicon dioxide selectively without damage is not known.

For example, there is an example for planarizing the SiC, GaN, etc. by using an iron machine platen serving as a catalyst and a hydrogen peroxide solution. Moreover, there is a method for processing the surface of a Ga containing compound semiconductor, including forming GaN oxide by light or a voltage through the use of a neutral pH buffer solution containing Ga ions, and removing the GaN oxide through the use of a polishing tool. These methods are not applicable to a silicon dioxide film. In addition, since a treatment liquid in a saturated state is not used for the methods, selectivity of dissolution of target parts (convex portions 11p) is low, resulting in low processing efficiency.

Furthermore, for example, a method for processing a to-be-processed object by generating active species from a treatment liquid by means of a photocatalyst reaction, and generating a compound capable of being dissolved in the treatment liquid by means of a chemical reaction between the active species and a to-be-processed surface. Since a treatment liquid containing silicon dioxide in a saturated state is not used for the method, selectivity of dissolution of the target parts is low. As a result, processing efficiency is low.

In contrast, in the embodiment, the convex portions 11p of the silicon dioxide film 10 are dissolved selectively by controlling the equilibrium state of the treatment liquid 30. For this reason, the thickness of the silicon dioxide film 10 to be removed for planarization may be almost equivalent to the height h1 of irregularity 11, and thus efficiency of planarization is high. Furthermore, since no abrasive grain is used, scratches are not generated.

According to the method for chemical planarization according to the embodiment, a method for chemical planarization for planarizing a silicon dioxide film by suppressing generation of scratches can be provided.

Hereinafter, some other examples of the method for chemical planarization according to the embodiment will be described.

Figure 4:
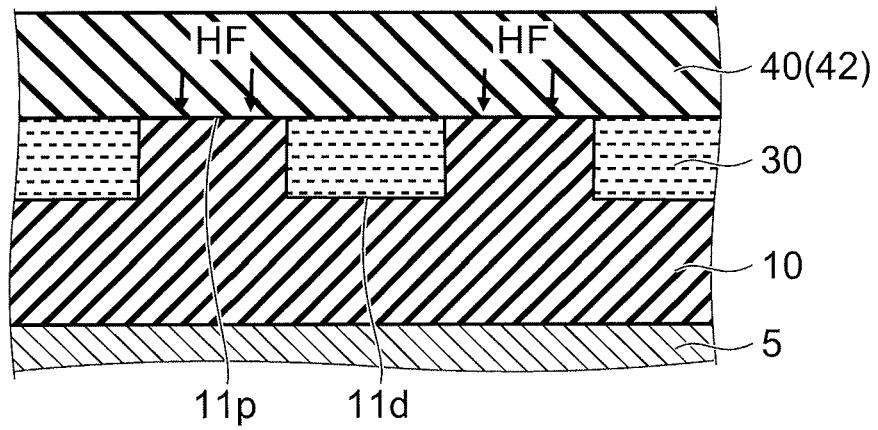
FIG. 4 is a schematic cross-sectional view illustrating another method for chemical planarization according to the first embodiment.

FIG. 4 is a schematic cross-sectional view illustrating another method for chemical planarization according to the first embodiment. As shown in FIG. 4, in the case, a treatment plate 40 capable of exuding hydrofluoric acid (HF) is used. That is, in a second approach for changing an equilibrium state, an exudation plate 42 capable of exuding hydrofluoric acid is used as the treatment plate 40.

In the approach, by bringing the exudation plate 42 (treatment plate) into contact with the convex portions 11p, hydrofluoric acid is supplied toward the convex portions 11p. As the exudation plate 42, for example, a porous structure is used. The aqueous solution of hydrofluoric acid is exuded from pores of the porous structure. Near the porous structure, by hydrofluoric acid, the equilibrium state of formula (1) moves from the right side to the left side. Therefore, the convex portions 11p being in contact with the porous structure (exudation plate 42) can be dissolved preferentially. Because of this, the silicon dioxide film 10 is planarized.

Figure 5:
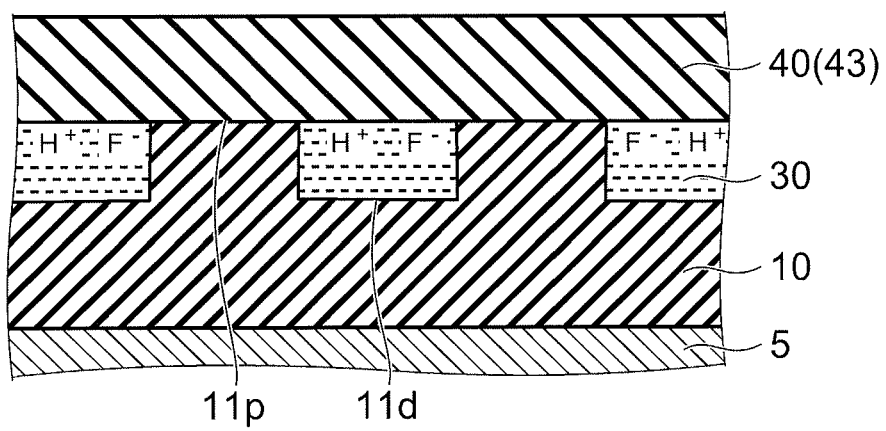
FIG. 5 is a schematic cross-sectional view illustrating further another method for chemical planarization according to the first embodiment.

FIG. 5 is a schematic cross-sectional view illustrating further another method for chemical planarization according to the first embodiment. As shown in FIG. 5, in the case, a treatment plate 40 generating a fluorine ion ($F^-$) from a treatment liquid 30 is used. That is, in a third approach for changing an equilibrium state, a catalyst plate 43 generating fluorine ions ($F^-$) from the treatment liquid 30 is used as the treatment plate 40.

As the catalyst plate 43, for example, a platinum film (platinum plate) or the like is used. On and near the face of the catalyst plate 43, hydrofluoric acid is dissociated into $H^+$ and $F^-$. While being brought into contact with the convex portions 11p, the catalyst plate 43 (treatment plate 40) generates fluorine ions near the convex portions 11p. This moves the equilibrium state of formula (1) from the right side to the left side. Because of this, the convex portions 11p being in contact with the catalyst plate 43 can be dissolved preferentially. Therefore, the silicon dioxide film 10 is planarized. In addition to this, as the catalyst plate 43, at least any of platinum, a platinum ruthenium alloy, a rare earth metal, a compound of a rare earth metal, cobalt, a compound of cobalt, and a carbon compound of cobalt etc. can be used.

Figure 6:
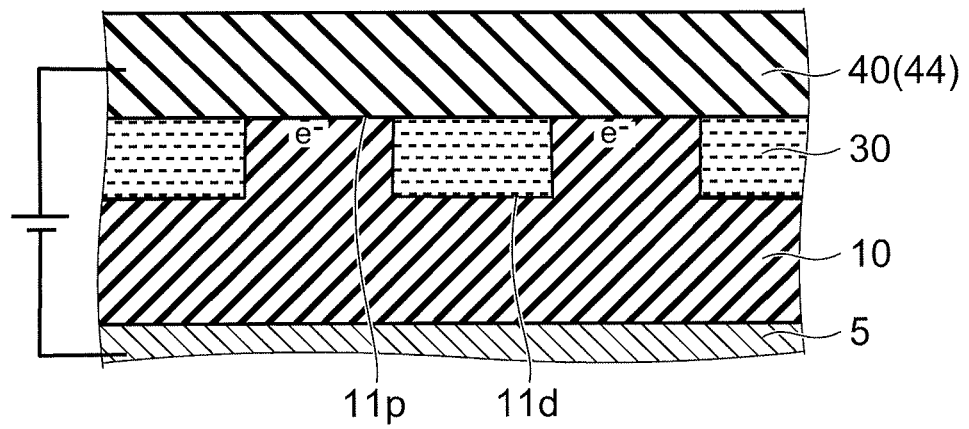
FIG. 6 is a schematic cross-sectional view illustrating still another method for chemical planarization according to the first embodiment.

FIG. 6 is a schematic cross-sectional view illustrating still another method for chemical planarization according to the first embodiment. As shown in FIG. 6, in the case, a conductive treatment plate 40 is used. That is, in a fourth approach for changing an equilibrium state, an electrode plate 44 is used as the treatment plate 40.

For example, by bringing the electrode plate 44 (conductive treatment plate 40) into contact with the convex portions 11p and applying a voltage to the convex portions 11p, charges (for example, electrons $e^-$) are supplied near the convex portions 11p. Because of this, hydrofluoric acid is generated from the treatment liquid 30.

For example, if ionization of the treatment liquid 30 (solution) is taken into consideration, the equilibrium formula of formula (1) can be written as the following formula (2).

$$H^+ + HSiF_6^- + 2H_2O \rightarrow SiO_2 + 6H^+ + 6F^- \qquad (2)$$

When electrons $e^-$ are supplied from the electrode plate to the treatment liquid 30 by bringing the electrode plate 44 into contact with the treatment liquid 30, the electrons $e^-$ are attracted by hydrogen ions H⁺. Because of this, at the left side of formula (2), a reaction represented by the following formula (3) is generated.

$$2H^+ + 2e^- \rightarrow H_2 \qquad (3)$$

Therefore, by the supply of electrons e⁻, the equilibrium of the treatment liquid 30 near the electrode plate 44 can be moved from the right side state to the left side state of formula (1). That is, near the convex portions 11p, the equilibrium state of formula (1) is moved from the right side to the left side. Because of this, the convex portions 11p near the electrode plate 44 can be dissolved preferentially. Thus, the silicon dioxide film 10 is planarized.

In the embodiment, combination of the first to the fourth approaches for changing an equilibrium state may be used. That is, in the method for chemical planarization according to the embodiment, changing an equilibrium state can includes performing at least any of treatments including a treatment using the temperature controlling plate 41, a treatment using the catalysis plate 43 and a treatment using the electrode plate 44.

In the method for chemical planarization according to the embodiment, the process (step S120) of decreasing the height of the irregularity 11, in addition to generating dissolution of the convex portions 11p of the irregularity 11, can further include generating precipitation of silicon dioxide on the concave portions 11d of the irregularity 11 by changing the equilibrium state of the treatment liquid 30. With regard to precipitation of silicon dioxide, for example, a method used in a second embodiment described below can be applied.

Second Embodiment

In the embodiment, the equilibrium condition of a treatment liquid 30 (hydrosilicofluoric acid aqueous solution containing silicon dioxide dissolved therein at a saturated concentration) is changed while bringing a silicon dioxide film 10 having irregularity 11 into contact with (for example, immersing the film 10 in) the treatment liquid 30. Because of this, precipitation of silicon dioxide on the concave portions 11d of the irregularity 11 is generated, and the height of the irregularity 11 is decreased. When the equilibrium is shifted from the left side to the right side in formula (1), silicon dioxide can be precipitated. Hereinafter, some examples of a method for precipitating silicon dioxide at the concave portions 11d of the irregularity 11 will be described.

Figure 7:
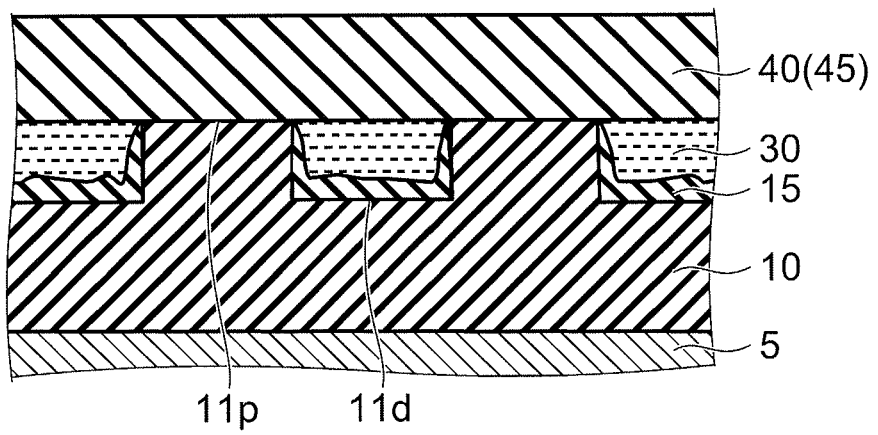
FIG. 7 is a schematic cross-sectional view illustrating a method for chemical planarization according to the second embodiment.

FIG. 7 is a schematic cross-sectional view illustrating a method for chemical planarization according to the second embodiment.

As shown in FIG. 7, while bringing a treatment plate 40 (treatment body 45) into contact with the convex portions 11p in a state in which the silicon dioxide film 10 is brought into contact with the treatment liquid 30, and while changing the relative positions between the convex portions 11p and the treatment plate 40, silicon dioxide 15 is precipitated on the concave portions 11d by changing the equilibrium state of the treatment liquid 30. For example, by increasing the temperature of the treatment liquid 30, the equilibrium state of the treatment liquid 30 is changed, and thus silicon dioxide 15 is precipitated on the concave portions 11d.

For example, by increasing the temperature of the treatment liquid 30, silicon dioxide 15 is precipitated on the silicon dioxide film 10, and at the same time, by bringing the convex portions 11p of the silicon dioxide film 10 into contact with the polishing face of the treatment body 45, the silicon dioxide film 10 (base body 5) and the polishing face are relatively moved. The silicon dioxide 15 precipitated from the treatment liquid 30 deposits on the entire face of the silicon dioxide film 10. At that time, since the convex portions 11p of the silicon dioxide film 10 is brought into contact with the polishing face of the treatment body 45, the silicon dioxide 45 deposited on the convex portions 11p is removed. Because of this, it is possible to fill the inside of the concave portions 11d with the silicon dioxide 15 by depositing the silicon dioxide 15 on the inside of the concave portions 11d while removing the silicon dioxide 15.

In this way, in the method for chemical planarization according to the embodiment, there can be provided a method for chemical planarization, which planarizes a silicon dioxide film while suppressing generation of scratches.

Furthermore, according to the method for the embodiment, the inside of the scratches formed in the silicon dioxide film 10 can be filled with the silicon dioxide 15. In this way, according to the method, the irregularity of the silicon dioxide film 10 can be planarized while remedying scratches. Because of this, according to the method, even when damages such as scratches are generated, the damages can be remedied.

For example, the silicon dioxide 15 can also be precipitated by adding a substance that consumes hydrofluoric acid by binding to the hydrofluoric acid, to the treatment liquid 30. Because of this a substance, for example, boric acid or aluminum etc. can be used. For example, the equilibrium state of formula (1) can be moved from the left side to the right side by adding boric acid or aluminum to the treatment liquid 30 to thereby consume HF in the right side of formula (1). In this state, by bringing the convex portions 11p of the silicon dioxide film 10 into contact with the polishing face of the treatment body 45 while bringing the silicon dioxide film 10 into contact with (for example, immersing the film 10 in) the treatment liquid 30, the silicon dioxide film 10 and the treatment body 45 are moved relatively. Because of this, for example, precipitation of the silicon dioxide 15 on the concave portions 11d and remedying of scratches can be carried out at the same time.

Moreover, by supplying charges into the treatment liquid 30, the silicon dioxide 15 can be precipitated. For example, by installing an electrode in the treatment liquid 30 to thereby supply charges (for example, positive holes h⁺) therein from the electrode, HF of the right side in formula (1) is consumed.

Positive holes h⁺ are attracted by fluorine ions F⁻. Because of this, a reaction represented by the following formula (4) is generated at the right side in formula (2).

$$2F^- + 2h^+ \rightarrow F_2 \qquad (4)$$

Therefore, by supplying positive holes h⁺, it is possible to move the equilibrium state of formula (1) from the left side to the right side, and to precipitate the silicon dioxide 15.

While bringing the silicon dioxide film 10 into contact with (for example, immersing the film 10 in) the treatment liquid 30 in a state in which charges (for example, positive holes h⁺) are supplied from the electrode, the silicon dioxide film 10 and the treatment body 45 are moved relatively by bringing the convex portions 11p of the silicon dioxide film 10 into contact with the polishing face of the treatment body 45. Because of this, for example, precipitation of the silicon dioxide 15 on the concave portions 11d and remedying of scratches can be carried out at the same time.

The methods described above may be carried out in a combined manner. That is, changing the equilibrium state of the treatment liquid 30 to thereby precipitate the silicon dioxide 15 on the concave portions 11d can include any of treatments of increasing the temperature of the treatment liquid 30, adding a substance that consumes hydrofluoric acid by binding to the hydrofluoric acid, to the treatment liquid 30, and supplying charges into the treatment liquid 30.

Combination of the methods for chemical planarization according to the first and the second embodiments may be used. That is, the process of decreasing the height of the irregularity 11 (step S120), in addition to generating precipitation of silicon dioxide on the concave portions 11d, can further include generating dissolution of the convex portions 11p.

By applying the methods for chemical planarization according to the first and the second embodiments, foreign substances on the surface of the silicon dioxide film 10 can also be removed. For example, before a lithography process, by applying the methods for chemical planarization according to the first and the second embodiments, to the surface of the silicon dioxide film 10 before being subjected to lithography, convex foreign substances present on the surface of the silicon dioxide film 10 can be removed. When the methods are applied to a nano-imprint method, a template that is the original plate of imprint will not be destroyed due to convex foreign substances, and thus a good fine pattern can be formed. Further, by applying the above described methods to any process, not limited to processes before the lithography process, foreign substances can be removed. It is also possible to planarize and remedy scratches and irregularity of the rear face of a wafer by applying the methods for chemical planarization according to the first and the second embodiments.

Third Embodiment

A third embodiment relates to a manufacturing method for an electronic apparatus. The electronic apparatus includes, for example, a semiconductor device containing a semiconductor layer. The semiconductor device includes, for example, a semiconductor memory, a high-speed logic LSI, a system LSI, and a memory-logic hybrid LSI, etc. The electronic apparatus can also include devices such as MEMS (micro electro mechanical systems).

The manufacturing method includes a process of forming a silicon dioxide film 10 on a base body 5. In addition, the manufacturing method further includes steps S110 and S120. That is, the manufacturing method can further include a process of subjecting the silicon dioxide film 10 to the methods for chemical planarization described according to the first and the second embodiments.

In the manufacturing method, by using a method for chemical planarization capable of effectively planarize a silicon dioxide film while suppressing generation of scratches, an electronic apparatus having a high performance and minute element can be manufactured at a high yield.

Fourth Embodiment

Figure 8:
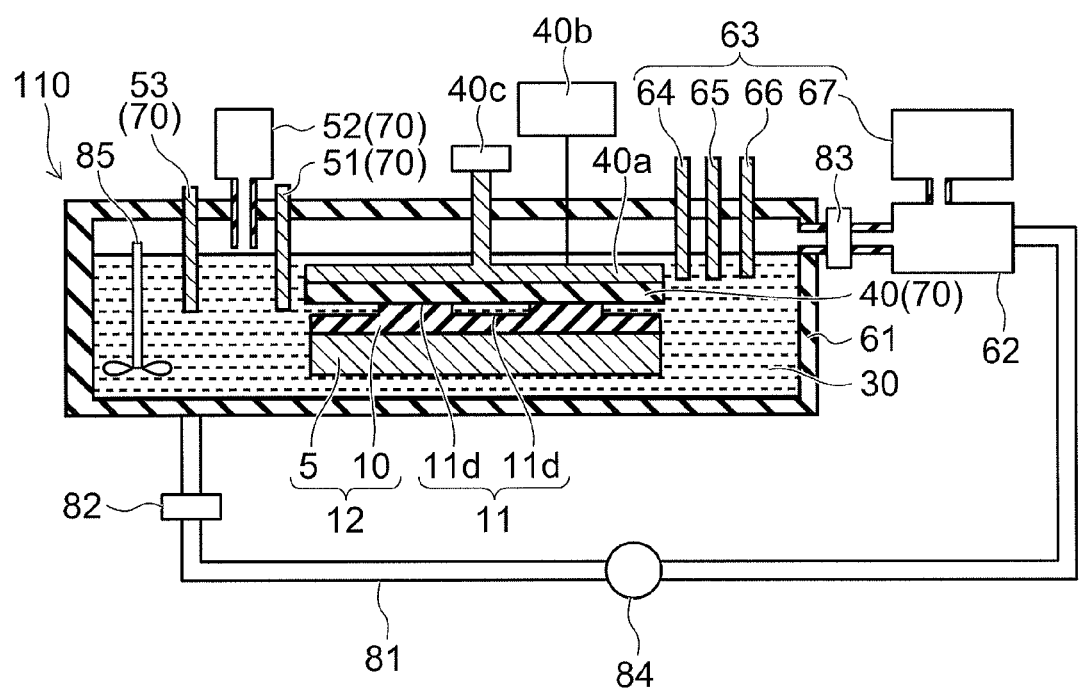
FIG. 8 is a schematic cross-section view illustrating a chemical planarization apparatus 110 according to a fourth embodiment.

FIG. 8 is a schematic cross-section view illustrating a chemical planarization apparatus 110 according to a fourth embodiment.

As shown in FIG. 8, the chemical planarization apparatus 110 according to the fourth embodiment, includes: a treatment container 61; a treatment liquid supply part 62; a control part 63; and an equilibrium changing part 70.

The treatment container 61 can store a substrate 12 to be treated. The substrate 12 to be treated is provided with a silicon dioxide film 10 having irregularity 11. The substrate 12 to be treated includes, for example, a base body 5 and the silicon dioxide film 10 provided on the base body 5.

A treatment liquid supply part 62 supplies a treatment liquid 30 into the treatment container 61. The treatment liquid 30 contains a hydrosilicofluoric acid aqueous solution. The hydrosilicofluoric acid aqueous solution contains silicon dioxide. For example, the hydrosilicofluoric acid aqueous solution can contain the silicon dioxide dissolved at a saturated concentration.

The control part 63 controls the concentration of silicon dioxide in the treatment liquid 30 and the temperature of the treatment liquid 30. The control part 63 can include, for example, a temperature detection part 64 for detecting the temperature of the treatment liquid 30. The control part 63 can further include a temperature control part 65 for increasing or decreasing the temperature of the treatment liquid 30 depending on the result of temperature detection by the temperature detection part 64. The control part 63 can further include a concentration detection part 66 for detecting the concentration of silicon dioxide in the treatment liquid 30. The control part 63 can further include an adjustor supply part 67. The adjustor supply part 67 supplies an adjustor into the treatment liquid 30 depending on the detection result of the concentration of silicon dioxide. As the adjustor, for example, at least any of a solution containing fluorine, a hydrosilicofluoric aqueous solution dissolved with silicon dioxide at a saturated concentration, and an additive (aluminum or a boric acid solution etc.) for consuming fluorine, is used.

The equilibrium changing part 70 decreases the height of the irregularity 11 by, for example, generating dissolution of the convex portions 11p of the irregularity 11 while changing the equilibrium state of the treatment liquid 30 in a state in which the silicon dioxide film 10 is brought into contact with the treatment liquid 30.

As the equilibrium changing part 70, for example, a treatment plate 40 can be used. As the treatment plate 40, for example, a temperature control plate 41, an exudation plate 42, a catalyst plate 42, or an electrode plate 44 etc. can be used. Therefore, the equilibrium state can be changed. Because of this, preferential dissolution of the convex portions 11p of the irregularity 11 can be generated.

Furthermore, the equilibrium changing part 70 decreases the height of the irregularity 11 by, for example, generating precipitation of silicon dioxide 15 on the concave portions 11d of the irregularity 11 while changing the equilibrium state of the treatment liquid 30 in a state in which the silicon dioxide film 10 is brought into contact with the treatment liquid 30.

As the equilibrium changing part 70, for example, a treatment liquid temperature controlling part 51 for increasing the temperature of the treatment liquid 30, can be used. As the equilibrium changing part 70, for example, an addition part 52 for adding a substance that consumes hydrofluoric acid by binding to the hydrofluoric acid, to the treatment liquid 30, can be used. As the equilibrium changing part 70, for example, an electrode 53 for supplying charges into the treatment liquid 30, can be used. Because of this, by changing the equilibrium state of the treatment liquid 30, the silicon dioxide 15 can be precipitated on the concave portions 11d. Moreover, it is possible to fill silicon dioxide 15 inside scratches formed in the silicon dioxide film 10.

As illustrated in FIG. 8, the chemical planarization apparatus 110 may further include a drive part 40c. In the case, the drive part 40c may, for example, relatively move (for example, rotate) the treating plate 40. The drive part 40c may relatively move (rotate) the substrate 12 to be treated. When an exudation plate 42 is used as the treatment plate 40, the drive part 40c may have a function to supply hydrofluoric acid to the exudation plate 42. When a temperature controlling plate 41 is used as the treatment plate 40, the chemical planarization apparatus 110 may further include a control plate temperature controlling part 40a for controlling the temperature of the temperature controlling plate 41. At that time, the chemical planarization apparatus 110 may further include a control driving part 40b for driving the control plate temperature controlling part 40a.

The chemical planarization apparatus 110 may further include a piping 81 connected to the treatment container 61. One end of the piping 81 is connected to the treatment container 61, and the other end of the piping 81 is connected, for example, to the treatment liquid supplying part 62. By the piping 81, the treatment liquid 30 can be circulated between the treatment container 61 and the treatment liquid supplying part 62. Because of this, the efficiency in the use of the treatment liquid 30 improves. A pump 84 can be disposed to the piping 81. Furthermore, the piping 81 can be provided with a filter 82 at a position between the treatment container 61 and the pump 84. Because of this, impurities etc. can be trapped. Moreover, the piping may be provided with a filter 83 at a position between the treatment liquid supplying part 62 and the treatment container 61. The chemical planarization apparatus 110 may further include an agitation part 85 which is disposed to the treatment container 61, and which agitates the treatment liquid 30.

In the embodiment, the equilibrium changing part 70 may decrease the height of the irregularity 11 by generating at least any of dissolution of the convex portions 11p and precipitation of silicon dioxide on the concave portions 11d, while changing the equilibrium state of the treatment liquid 30 in a state in which the silicon dioxide film is brought into contact with the treatment liquid 30.

According to the embodiment, a method for chemical planarization and a chemical planarization apparatus, which planarize a silicon dioxide film while suppressing generation of scratches are provided.

Hereinabove, exemplary embodiments of the invention are described with reference to specific examples. However, the invention is not limited to these specific examples. Specific configurations of elements used in the method for chemical planarization, such as, for example, the silicon dioxide film, the base body, the to-be-treated substrate, the treatment liquid, the treatment plate, the temperature controlling plate, the exudation plate, the catalyst plate, the electrode plate, and treatment body, and included by the chemical planarization apparatus, such as, for example, the treatment container, the treatment liquid supplying part, the control part, the equilibrium changing part, the treatment liquid temperature controlling part, addition part, and the electrode are included in the scope of the invention, as long as one skilled in the art can carry out the invention in the same manner and achieve the same effects by suitably selecting them from a known scope.

Further, any two or more components of the specific examples may be combined within the extent of technical feasibility and are included in the scope of the invention to the extent that the purport of the invention is included.

Moreover, all chemical planarization methods and manufacturing methods for chemical planarization apparatuses which can be embodied by one skilled in the art by suitably changing design based on the chemical planarization methods and the manufacturing methods for chemical planarization apparatuses described above as embodiments of the invention also are within the scope of the invention to the extent that the purport of the embodiments of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for chemical planarization comprising:
preparing a treatment liquid containing a hydrosilicofluoric acid aqueous solution containing silicon dioxide dissolved in the hydrosilicofluoric acid aqueous solution at a saturated concentration;
preparing a silicon dioxide film having an irregularity, the irregularity including a concave portion of silicon dioxide and a plurality of convex portions of silicon dioxide; and
making a first dissolution rate larger than a second dissolution rate to remove at least a part of the silicon dioxide at the convex portions and decrease a distance between a top surface of the silicon dioxide at the convex portions and a top surface of the silicon dioxide at the concave portion, the making being performed by changing equilibrium state of the treatment liquid at areas being in contact with the convex portions in a state in which the silicon dioxide film is brought into contact with the treatment liquid, the first dissolution rate being a dissolution rate of the silicon dioxide at the convex portions with respect to the treatment liquid, and the second dissolution rate being a dissolution rate of the silicon dioxide at the concave portion with respect to the treatment liquid, wherein
the changing equilibrium state includes carrying out treatment of decreasing temperature of the convex portions by bringing a temperature controlling plate into contact with the convex portions, and the temperature controlling plate is capable of being cooled, and
the treatment liquid substantially contains no abrasive grain.

2. The method according to claim 1, wherein the changing equilibrium state further includes carrying out treatment of supplying hydrofluoric acid toward the convex portions by bringing an exudation plate into contact with the convex portions, and the exudation plate is capable of exuding hydrofluoric acid.

3. The method according to claim 2, wherein the exudation plate is a porous structure.

4. The method according to claim 1, wherein the changing equilibrium state further includes carrying out treatment of generating fluorine ions ($F^-$) near the convex portions from the treatment liquid by bringing a catalyst plate into contact with the convex portions.

5. The method according to claim 4, wherein the catalyst plate includes at least one of platinum, a platinum ruthenium alloy, a rare earth metal, a compound of a rare earth metal, cobalt, a compound of cobalt, and a carbon compound of cobalt.

6. The method according to claim 1, wherein the changing equilibrium state further includes carrying out treatment of generating hydrofluoric acid from the treatment liquid by bringing an electrode plate into contact with the convex portions and by applying a voltage to the convex portions to supply charges near the convex portions.

7. The method according to claim 6, wherein the charges contain electrons.

8. The method according to claim 1, wherein the contact of the silicon dioxide film with the temperature controlling plate includes changing a relative position between the silicon dioxide film and the treatment plate.

9. The method according to claim 1, wherein the decreasing height of the irregularity further includes generating precipitation of silicon dioxide on the concave portions by changing equilibrium state of the treatment liquid.

10. The method according to claim 1, wherein bringing the silicon dioxide film into contact with the treatment liquid includes immersing the silicon dioxide film in the treatment liquid.

11. The method according to claim 1, wherein the irregularity has convex portions and concave portions, and distance between upper face of the convex portions and lower face of the concave portions is not less than 30 nm and not more than 2 μm.

12. The method according to claim 1, further comprising forming the silicon dioxide film by a chemical vapor deposition method, or a coating method.

* * * * *